United States Patent [19]

Baird et al.

[11] Patent Number: 4,675,092
[45] Date of Patent: Jun. 23, 1987

[54] METHOD OF PRODUCING THIN FILM ELECTROLUMINESCENT STRUCTURES

[75] Inventors: Donald H. Baird, Newton; Martin S. McDonough, deceased, late of Andover, both of Mass., by Carol C. McDonough, executrix

[73] Assignee: GTE Laboratories Incorporated, Waltham, Mass.

[21] Appl. No.: 845,223

[22] Filed: Mar. 27, 1986

[51] Int. Cl.$^4$ .............................................. C23C 14/34
[52] U.S. Cl. ........................... 204/192.26; 204/192.29; 204/192.15
[58] Field of Search ............... 204/192 R, 192 P, 298, 204/192.29, 192.26

[56] References Cited

U.S. PATENT DOCUMENTS

| | | | |
|---|---|---|---|
| 4,027,192 | 5/1977 | Hanak | 204/192 P X |
| 4,279,726 | 7/1981 | Baird et al. | 204/192 P |
| 4,389,295 | 6/1983 | Davey et al. | 204/192 P |

OTHER PUBLICATIONS

R. Tueta et al., "Fabrication . . . Applications", Met. and Protective Coat., Thin Solid Films, 80(1981) pp. 143–148.
Hanak, "Electro . . . Films", Proc. 6th Internl. Vac. Congr. 1974, Jap. J. Appl. Phys. Suppl. 2, Pt. 1,1974, pp. 809–812.
Murray et al., "Caracteristique . . . ", Thin Solid Films, 1973, 17, pp. 75–83.
Murray et al., "ZnS . . . Photocells", Electronics Letter, vol. 9, No. 21, 10/73, pp. 491–493.
Schonbrodt et al., "Preparation . . . ", Thin Solid Films, 1981, 81, pp. 45–52.

Primary Examiner—John F. Niebling
Assistant Examiner—Nam X. Nguyen
Attorney, Agent, or Firm—David M. Keay

[57] ABSTRACT

Method of producing a thin film electroluminescent device by sputtering a first transparent electrode of indium tin oxide or tin oxide onto a glass substrate, sputtering a layer of insulating material, for example barium tantalate, over the transparent electrode, and then forming a phosphor layer of zinc sulfide with manganese as an activator on the layer of insulating material. To form the phosphor layer electrical energy is applied to a target containing elemental zinc in an atmosphere containing hydrogen sulfide and argon to cause sputtering therefrom. Elemental zinc reacts with the hydrogen sulfide to deposit a layer of zinc sulfide over the layer of insulating material. The manganese is cosputtered either from a separate target or from a single target incorporating both zinc and manganese.

14 Claims, 1 Drawing Figure

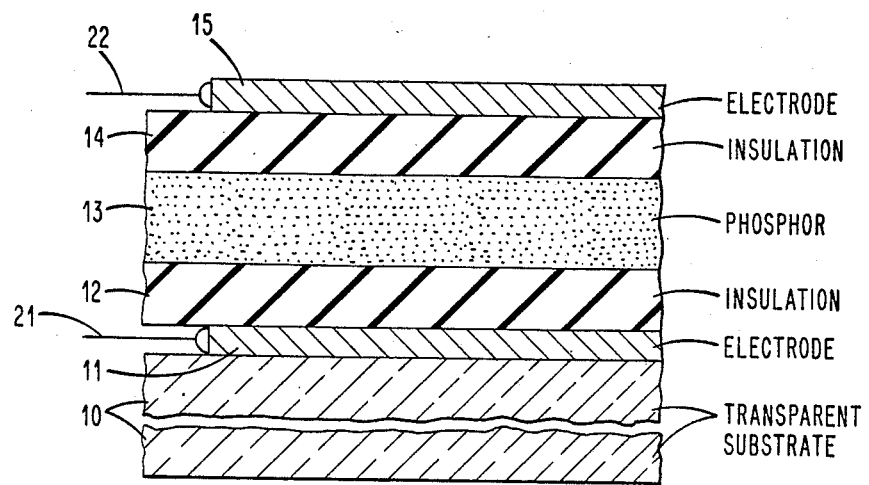

METHOD OF PRODUCING THIN FILM ELECTROLUMINESCENT STRUCTURES

BACKGROUND OF THE INVENTION

This invention relates to thin film electroluminescent devices. More particularly, it is concerned with methods of depositing the phosphor layers of thin film electroluminescent devices by sputtering.

Thin film electroluminescent devices are employed for various forms of displays. Typically the devices employ a transparent substrate having on one surface a very thin conductive electrode which is substantially transparent. This first electrode is covered with an insulating layer. A layer of a suitable phosphor material overlies the insulating layer. The phosphor layer is covered with another insulating layer, and a second conductive electrode of an appropriate pattern is formed on the second insulating layer. Under operating conditions a voltage is applied between the two electrodes causing the portion of the phosphor layer between the electrodes to luminesce, thus providing a visible pattern when viewed through the transparent substrate.

Various methods have been used to deposit the layers constituting thin film electroluminescent devices including thermal evaporation, electron beam evaporation, chemical vapor deposition, and sputtering. From the point of view of an ecomonical manufacturing process, it is desirable that all the layers be deposited by sputtering. There is no problem as to the conductive and insulating layers since sputter deposition techniques for the materials typically employed for these layers are well known. Heretofore, however, it has been difficult to obtain phosphor layers of satisfactory characteristics by employing sputtering techniques. In order to obtain satisfactory phosphor layers they have usually been formed by employing evaporation methods, which are less easily adapted to large-scale production than is sputtering and, therefore, are more expensive.

Typically the phosphor layer is a host of zinc sulfide (ZnS) containing an activator, frequently manganese (Mn). In forming zinc sulfide phosphor layers by sputtering, the conventional technique includes applying rf energy to a target of zinc sulfide enclosed in a chamber containing a sputtering atmosphere of argon and a small quantity of hydrogen sulfide. One of the disadvantages of this process in producing phosphor layers in electroluminescent devices is that during the target erosion process very small particles of zinc sulfide tend to form. Many of these particles impinge on the substrate and become incorporated into the growing film where they represent discontinuities in both the geometric shape and crystal structure of the otherwise highly oriented phosphor film. In addition after exposure of a zinc sulfide target to air, a long period of presputtering is necessary in order to return it to a safisfactory condition for use as a sputtering target.

SUMMARY OF THE INVENTION

Thin film electroluminescent structures having uniform, high-quality zinc sulfide phosphor films are produced by the sputtering method in accordance with the present invention. The method comprises providing a substrate of transparent material having a transparent film of conductive material adherent thereto and a coating of insulating material overlying the transparent film. The substrate and a target containing elemental zinc are placed in a chamber enclosing an atomsphere containing hydrogen sulfide. Electrical energy is applied to the target to cause sputtering therefrom whereby elemental zinc reacts with the hydrogen sulfide to deposit a layer of zinc sulfide over the coating of insulating material.

BRIEF DESCRIPTION OF THE DRAWING

The single FIGURE of the drawing is a representation in elevational cross-section of a fragment of a thin film electroluminescent structure in accordance with the present invention.

For a better understanding of the present invention, together with other and further objects, advantages, and capabilities thereof, reference is made to the following disclosure and appended claims in connection with the above-described drawing.

DETAILED DESCRIPTION OF THE INVENTION

The sole FIGURE of the drawing illustrates a fragment of a thin film electroluminescent device. The device includes a substrate 10 which is transparent and typically is of glass. A thin transparent conductive electrode 11 which typically is of indium tin oxide or tin oxide is formed on the surface of the glass substrate 10. The conductive electrode 11 is usually of a particular predetermined pattern depending on the display. The electrode 11 is covered by a layer of insulating material 12 which may be silicon nitride, barium tantalate, or other suitable material. The thin film electroluminescent phosphor material 13 is deposited on the insulating layer 12. Typically the phosphor film 13 consists of a host material such as zinc sulfide (ZnS) and an activator such as manganese. A second insulating layer 14, which may be of the same material as the first layer 12 or of a different material, is deposited over the phosphor film 13. A second electrode 15, usually of aluminum, is formed on the surface of the insulating layer 14 in a predetermined pattern. As indicated symbolically by the leads 21 and 22, electrical connections are applied to the electrodes 11 and 15, respectively. A voltage applied across the electrodes causes intervening phosphor material to electroluminesce, thus producing a visible display to an observer looking through the glass substrate 10.

The electrode 11 may be deposited onto the glass substrate 10 by employing known sputtering techniques. Similarly, the layer of insulating material 12 may be deposited on the first electrode 11 by sputtering. After the phosphor layer 13 is deposited, either in accordance with prior art practices or in accordance with the present invention as will be described hereinbelow, the second layer of insulating material 14 is deposited by sputtering. The second electrode 15 is usually deposited by employing known evaporation techniques.

In the fabrication of thin film electroluminescent devices in accordance with the present invention, zinc sulfide is deposited by a sputter reaction process employing a metallic target of elemental zinc in an atmosphere containing hydrogen sulfide ($H_2S$) and an inert gas. The procedure is carried out in conventional sputtering apparatus. Under suitable values of substrate temperature and hydrogen sulfide pressure, deposits of stoichiometric zinc sulfide can be obtained. More particularly, satisfactory results are obtained when the substrate temperature is maintained in the range of about 100° to about 350° C. and the concentration of hydrogen sulfide in the sputtering gas is in the range of about 5% to about 20% by volume with the remainder being argon.

In order to provide a useful electroluminescent film the zinc sulfide host is activated, or doped, with a suitable activator, typically manganese. Activated films may be formed by cosputtering manganese from a separate target. In accordance with the teachings in U.S. Pat. No. 4,279,726 to Baird and McDonough the substrate may be rotated so as to pass sequentially under the zinc and manganese targets. The size of the aperture through which the manganese is sputtered and the rf energy applied to the two targets are such as to produce a zinc sulfide phosphor film with a manganese content in the range of about 0.5 to 1.0 weight percent. The manganese may be incorporated with the zinc in a single target, either by being dispersed throughout the target or by being alloyed with the zinc. The relative amounts of zinc and manganese are chosen so that upon sputtering, the deposited phosphor film will have the desired proportion of manganese. Activators other than manganese may be employed, in particular various of the rare earth elements. Rare earth activators may be also employed with a coactivator.

Devices of the structure illustrated in the drawing were produced by depositing indium tin oxide on a glass substrate 10 in a desired pattern to form the first electrodes 11 of a thickness of approximately 1000 to 2000 angstroms. An insulating layer 12 of barium tantalate of 2000 to 4000 angstroms thick was deposited by sputtering from a target of suitable source material in a suitable sputtering gas atmosphere. A zinc sulfide electroluminescent layer 13 was formed by cosputtering from one target consisting essentially of elemental zinc and another target of manganese while rotating the assemblage of the substrate 10 and layers 11 and 12 as described hereinabove. Particularly good results were obtained when the substrate temperature was maintained at approximately 200° to 250° C. and the sputtering gas was approximately 10% hydrogen sulfide by volume with the remainder being argon. The total gas pressure was maintained at approximately 10 microns. The rf power density applied to the elemental zinc target was 8 W/in$^2$. The resulting phosphor film 13 containing from 0.5 to 1.0 weight percent manganese was between 4000 to 6000 angstroms thick. The phosphor film 13 was then covered with a second insulating layer 14 of barium tantalate 2000 to 4000 angstroms thick which was also formed by sputtering. The final electrode 15 was formed by evaporating aluminum in the desired pattern. The aluminum electrode 15 was between 1000 to 2000 angstroms thick.

In thin film electroluminescent structures produced in accordance with the present invention as described hereinabove, uniform films of stoichiometric zinc sulfide were obtained. The particulate matter characteristically imbedded in zinc sulfide films sputtered from zinc sulfide targets was found to be virtually eliminated.

An important characteristic of electroluminescent devices is the charge density which can be sustained without electrical breakdown. Typically, electroluminescent devices are operated at a charge density of 2.5 $\mu C/cm^2$ or less. In many types of prior art devices electrical arcing tends to occur in localized regions when the charge density reaches 1.0 to 1.5 $\mu C/cm^2$ as the applied voltage is raised. Normally this arcing is "self-healing" in that the aluminum electrode is burned off in the immediate vicinity of the arc, and the device returns to normal stabilized operation. When the level of charge density is raised to the 2.5 to 3.5 $\mu C/cm^2$ range, however, localized arcing becomes great enough to cause the device to burn out without reaching stability.

A high percentage of devices fabricated in accordance with the present invention having individual segments of about 0.05 cm$^2$ in area were brought directly to charge densities of about 4 $\mu C/cm^2$ without suffering any localized arcing. Also, it was possible to achieve stability at charge densities above 5 $\mu C/cm^2$ with very few "self-healing" breakdown events. In many devices catastrophic device burnout did not occur until charge densities of 7 to 8 $\mu C/cm^2$ were reached. In addition, as the operating voltages of devices fabricated in accordance with the invention were raised, lighting was observed to take place in a fairly uniform manner. High brightness was obtained without the presence of scattered pinpoints of light such as would occur in prior art devices indicating discontinuities in the phosphor layer.

While there has been shown and described what is considered a preferred embodiment of the present invention, it will be obvious to those skilled in the art that various changes and modifications may be made therein without departing from the invention as defined by the appended claims.

What is claimed is:

1. The method of producing a thin film electroluminescent structure comprising
   providing a substrate of transparent material having a first transparent film of conductive material adherent thereto and a first coating of insulating material overlying said first transparent film of conductive material;
   placing said substrate, a first target consisting essentially of elemental zinc, and a second target consisting essentially of an activator material for zinc sulfide in a chamber enclosing an atmosphere including hydrogen sulfide and an inert gas;
   applying electrical energy to said first target and to said second target to cause sputtering of elemental zinc from said first target and to cause sputtering of activator material from said second target so that sputtered elemental zinc reacts with hydrogen sulfide to deposit zinc sulfide and sputtered activator material deposits with zinc sulfide to form a layer of zinc sulfide containing said activator material over said first coating of insulating material;
   depositing a second coating of insulating material overlying said layer of zinc sulfide containing said activator material; and
   forming a second layer of conductive material in a predetermined pattern overlying said second coating of insulating material.

2. The method in accordance with claim 1 including heating said substrate to a temperature between about 100° and about 350° C. while applying electrical energy to said first and second targets.

3. The method in accordance with claim 2 wherein said atmosphere enclosed by said chamber includes between about 5% and about 20% hydrogen sulfide by volume and the remainder being an inert gas.

4. The method in accordance with claim 3 wherein said activator material is manganese.

5. The method in accordance with claim 4 including heating said substrate to a temperature between about 200° and about 250° C. while applying electrical energy to said first and second targets; and wherein said atmosphere enclosed by said chamber includes about 10% hydrogen sulfide by volume and the remainder being argon.

6. The method in accordance with claim 5 wherein providing a substrate of transparent material having a first transparent film of conductive material adherent thereto and a first coating of insulating material overlying said transparent film of conductive material includes providing a substrate of transparent material having a first transparent film of conductive material in a predetermined pattern adherent thereto; and depositing a thin coating of insulating material overlying said first transparent film of conductive material.

7. The method in accordance with claim 6 wherein depositing a thin coating of insulating material overlying said first transparent film of conductive material includes placing said substrate of transparent material having a first transparent film of conductive material in a predetermined pattern adherent thereto in a sputtering chamber containing a target which is a source for said insulating material and enclosing a sputtering gas atmosphere, and applying electrical energy to said target to cause sputtering of material therefrom which deposits on said substrate and first transparent film to form said first coating of insulating material thereon; and depositing a second coating of insulating material overlying said layer of zinc sulfide containing said activator material includes placing said substrate of transparent material having said first transparent film of conductive material, said first coating of insulating material, and said layer of said zinc sulfide containing said activator material thereon in a sputtering chamber containing a target which is a source for said insulating material and enclosing a sputtering gas atmosphere, and applying electrical energy to said target to cause sputtering of material therefrom which deposits on said layer of zinc sulfide containing said activator material to form said second coating of insulating material thereon.

8. The method of producing a thin film electroluminescent structure comprising providing a substrate of transparent material having a first transparent film of conductive material adherent thereto and a first coating of insulating material overlying said first transparent film of conductive material;

placing said substrate and a target consisting essentially of an activator material for zinc sulfide and elemental zinc in a chamber enclosing an atmosphere including hydrogen sulfide and an inert gas;

applying electrical energy to said target to cause sputtering of elemental zinc and activator material therefrom so that sputtered elemental zinc reacts with hydrogen sulfide to deposit zinc sulfide and sputtered activator material deposits with zinc sulfide to form a layer of a zinc sulfide containing said activator material over said first coating of insulating material;

depositing a second coating of insulating material overlying said layer of zinc sulfide containing said activator material; and forming a second layer of conductive material in a predetermined pattern overlying said second coating of insulating material.

9. The method in accordance with claim 8 including heating said substrate to a temperature between about 100° and about 350° C. while applying electrical energy to said target.

10. The method in accordance with claim 9 wherein said atmosphere enclosed by said chamber includes between about 5% and about 20% hydrogen sulfide by volume and the remainder being an inert gas.

11. The method in accordance with claim 10 wherein said activator material is manganese.

12. The method in accordance with claim 11 including heating said substrate to a temperature between about 200° and about 250° C. while applying electrical energy to said target; and wherein said atmosphere enclosed by said chamber includes about 10% hydrogen sulfide by volume and the remainder being argon.

13. The method in accordance with claim 12 wherein providing a substrate of transparent material having a first transparent film of conductive material adherent thereto and a first coating of insulating material overlying said first transparent film of conductive material includes providing a substrate of transparent material having a first transparent film of conductive material in a predetermined pattern adherent thereto; and depositing a thin coating of insulating material overlying said transparent film of conductive material.

14. The method in accordance with claim 13 wherein depositing a thin coating of insulating material overlying said first transparent film of conductive material includes placing said substrate of transparent material having a first transparent film of conductive material in a predetermined pattern adherent thereto in a sputtering chamber containing a target which is a source for said insulating material and enclosing a sputtering gas atmosphere, and applying electrical energy to said target to cause sputtering of material therefrom which deposits on said substrate and transparent film to form said first coating of insulating material thereon; and depositing a second coating of insulating material overlying said layer of zinc sulfide containing said activator material includes placing said substrate of transparent material having said first transparent film of conductive material, said first coating of insulating material, and said layer of said zinc sulfide containing said activator material thereon in a sputtering chamber containing a target which is a source for said insulating material and enclosing a sputtering gas atmosphere, and applying electrical energy to said target to cause sputtering of material therefrom which deposits on said layer of zinc sulfide containing said activator material to form said second coating of insulating material thereon.

* * * * *